(12) United States Patent
Hu

(10) Patent No.: US 9,059,389 B2
(45) Date of Patent: Jun. 16, 2015

(54) FREE LAYERS WITH IRON INTERFACIAL LAYER AND OXIDE CAP FOR HIGH PERPENDICULAR ANISOTROPY ENERGY DENSITY

(71) Applicant: International Business Machines Corporation, Armonk, NY (US)

(72) Inventor: Guohan Hu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 77 days.

(21) Appl. No.: 13/911,588

(22) Filed: Jun. 6, 2013

(65) Prior Publication Data

US 2014/0361389 A1 Dec. 11, 2014

(51) Int. Cl.
| H01L 29/82 | (2006.01) |
| H01L 43/02 | (2006.01) |
| H01L 43/12 | (2006.01) |
| H01L 43/08 | (2006.01) |
| H01L 43/10 | (2006.01) |

(52) U.S. Cl.
CPC .............. *H01L 43/02* (2013.01); *H01L 43/12* (2013.01); *H01L 43/08* (2013.01); *H01L 43/10* (2013.01)

(58) Field of Classification Search
CPC .. H01L 43/08; H01L 21/67709; H01L 27/222
USPC .................................. 257/421, 422, 428, 435
See application file for complete search history.

(56) References Cited

U.S. PATENT DOCUMENTS

| 5,290,609 | A | 3/1994 | Horiike et al. |
| 7,727,911 | B2 | 6/2010 | Yoneda et al. |
| 8,183,652 | B2 | 5/2012 | Ranjan et al. |
| 8,283,741 | B2 | 10/2012 | Hu et al. |
| 8,324,697 | B2 | 12/2012 | Worledge |
| 8,493,695 | B1 | 7/2013 | Kaiser et al. |
| 2003/0228497 | A1 | 12/2003 | Wu et al. |
| 2005/0185455 | A1 | 8/2005 | Huai |
| 2005/0231854 | A1 | 10/2005 | Kawai |
| 2008/0088980 | A1 | 4/2008 | Kitagawa et al. |
| 2010/0020592 | A1 | 1/2010 | Hosotani et al. |
| 2010/0096716 | A1 | 4/2010 | Ranjan et al. |
| 2011/0260270 | A1 | 10/2011 | Zhang et al. |
| 2012/0018823 | A1 | 1/2012 | Huai et al. |
| 2012/0063218 | A1 | 3/2012 | Huai et al. |
| 2012/0087185 | A1 | 4/2012 | Zhou et al. |
| 2012/0135273 | A1 | 5/2012 | Horng et al. |
| 2012/0175717 | A1 | 7/2012 | Bessho et al. |
| 2012/0188818 | A1 | 7/2012 | Ranjan et al. |
| 2012/0205758 | A1 | 8/2012 | Jan et al. |

(Continued)

OTHER PUBLICATIONS

T.-I. Cheng et al., "Perpendicular magnetic anisotropy induced by a cap layer in ultrathin MgO/CoFeB/Nb," Journal of Applied Physics, vol. 112, No. 3, 2012, 033910, 4 pages.

(Continued)

*Primary Examiner* — Tan N Tran
(74) *Attorney, Agent, or Firm* — Cantor Colburn LLP; Vazken Alexanian

(57) ABSTRACT

A mechanism is provided for a spin torque transfer random access memory device. A tunnel barrier is disposed on a reference layer, and a free layer is disposed on the tunnel barrier. The free layer includes an iron layer as a top part of the free layer. A metal oxide layer is disposed on the iron layer, and a cap layer is disposed on the metal oxide layer.

4 Claims, 7 Drawing Sheets

(56) References Cited

U.S. PATENT DOCUMENTS

| | | | |
|---|---|---|---|
| 2012/0217595 A1 | 8/2012 | Zhou et al. | |
| 2012/0236631 A1 | 9/2012 | Park et al. | |
| 2012/0241878 A1 | 9/2012 | Hu et al. | |
| 2012/0280336 A1 | 11/2012 | Jan et al. | |
| 2012/0295370 A1* | 11/2012 | Zhou et al. | 438/3 |
| 2013/0175644 A1* | 7/2013 | Horng et al. | 257/421 |
| 2014/0048893 A1 | 2/2014 | Wu et al. | |

OTHER PUBLICATIONS

G. Jan et al., "High Spin Torque Efficiency of Magnetic Tunnel Junctions with MgO/CoFeB/MgO Free Layer" Applied Physics Express, vol. 5, No. 9, 2012, 093008, 3 pages.

J. H. Jung et al., "Strong perpendicular magnetic anisotropy in thick CoFeB films sandwiched by Pd and MgO layers," Applied Physics Letters, vol. 96, No. 4, 2010; 042503, 3 pages.

T. Liu et al., "Large enhanced perpendicular magnetic anisotropy in CoFeB/MgO system with the typical Ta buffer replaced by an Hf layer," AIP Advances, vol. 2, No. 3, 2012, 032151, 7 pages.

V. B. Naik et al., "Thick CoFeB with perpendicular magnetic anisotropy in CoFeB/MgO based magnetic tunnel junction," AIP Advances, vol. 2, No. 4, 2012, 042182, 9 pages.

J. J. Nowak, et al., "Demonstration of ultralow bit error rates for spin-torque magnetic random-access memory with perpendicular magnetic anisotropy." IEEE Magnetics Letters, vol. 2, 2011, 3000204, 4 pages.

Sato et al., "Perpendicular-anisotropy CoFeB-MgO magnetic tunnel junctions with a MgO/CoFeB/Ta/CoFeB/MgO recording structure," Applied Physics Letters 101, 022414 (2012), 5 pages.

D. C Worledge et al., "Spin torque switching of perpendicular Ta™ CoFeB ™ MgO-based magnetic tunnel junctions," Applied Physics Letters, vol. 98, 2011, 022501, 4 pages.

Choi, G-M., et al., "L10 Ordering of FePtB Films on a Thin MgO Layer," Applied Physics Express 4, Jan. 2011, (023001, pp. 1-3).

* cited by examiner

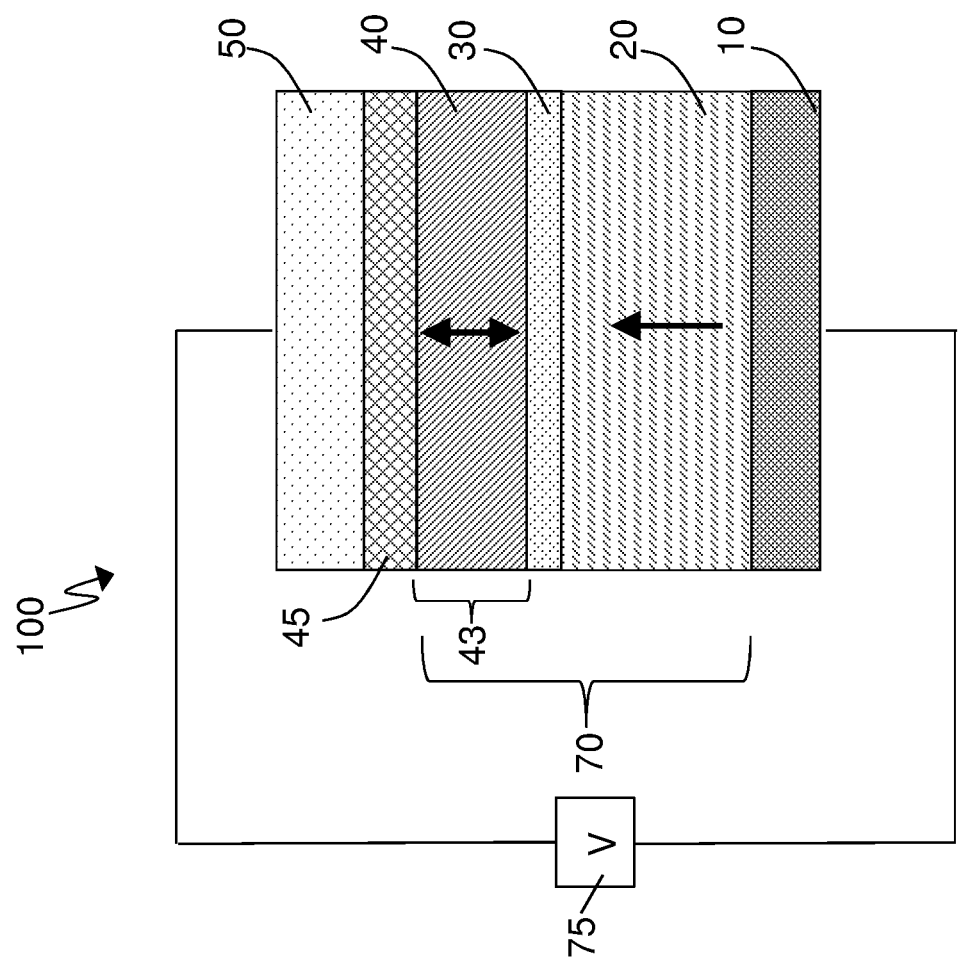

FREE LAYERS WITH IRON INTERFACIAL LAYER AND OXIDE CAP FOR HIGH PERPENDICULAR ANISOTROPY ENERGY DENSITY

BACKGROUND

The present invention relates generally to magnetic memory devices, and more specifically, to materials in and configurations for a spin torque transfer random access memory device.

Spin transfer torque is an effect in which the orientation of a magnetic layer in a magnetic tunnel junction or spin valve can be modified using a spin-polarized current. Charge carriers (such as electrons) have a property known as spin which is a small quantity of angular momentum intrinsic to the carrier. An electrical current is generally unpolarized (consisting of 50% spin-up and 50% spin-down electrons). A spin polarized current is one with more electrons of either spin. By passing a current through a thick magnetic layer, one can produce a spin-polarized current. If a spin-polarized current is directed into a magnetic layer, angular momentum can be transferred to the magnetic layer, changing its magnetic orientation. This can be used to flip the orientation of the magnet.

BRIEF SUMMARY

According to an exemplary embodiment, a spin torque transfer random access memory device is provided. The device includes a tunnel barrier disposed on a reference layer and a free layer disposed on the tunnel barrier. The free layer includes an iron layer as a top part of the free layer. A metal oxide layer is disposed on the iron layer, and a cap layer is disposed on the metal oxide layer.

According to another exemplary embodiment, a spin torque transfer random access memory device is provided. The device includes a tunnel barrier disposed on a reference layer and a free layer disposed on the tunnel barrier. The free layer includes a first magnetic layer disposed on the tunnel barrier, a spacer layer disposed on the first magnetic layer, a second magnetic layer disposed on the spacer layer, and an iron layer disposed on the second magnetic layer. A metal oxide layer is disposed on the iron layer, and a cap layer is disposed on the iron layer.

According to another exemplary embodiment, a method of forming a spin torque transfer random access memory device is provided. The method includes disposing a tunnel barrier on a reference layer, disposing a free layer on the tunnel barrier in which the free layer includes an iron layer as a top part of the free layer, disposing a metal oxide layer on the iron layer, and disposing a cap layer on the metal oxide layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 1A illustrates a cross-sectional view of a spin torque transfer random access memory (STT-RAM) device according to an embodiment.

DETAILED DESCRIPTION

Figure 1B:
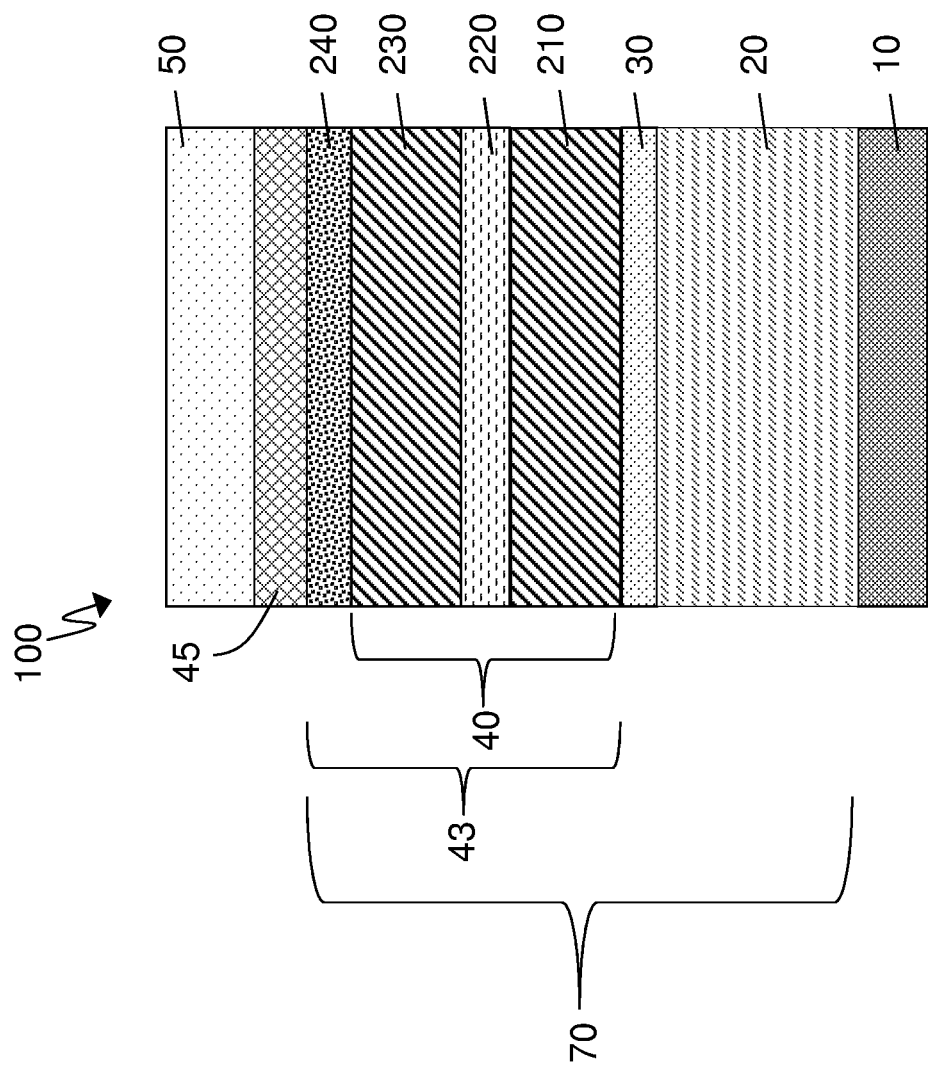
FIG. 1B illustrates a cross-sectional view of the STT-RAM device with an exemplary structure for the free layer with an iron layer according to an embodiment.

Embodiments disclose a free layer, a metal oxide layer, and a cap layer in which an iron (Fe) layer is directly on top of the free layer and in direct contact with the metal oxide layer. This interfacial Fe layer significantly improves the perpendicular anisotropy of the free layer material.

A CoFeB layer with perpendicular anisotropy has been identified as one of the most promising materials for the free layer in STT-RAM devices. Compared to other candidate materials, CoFeB has a few distinct advantages, including low damping for lower write voltage and good structure match with an MgO tunnel barrier for high TMR. TMR is a magnetoresistive effect that occurs in a magnetic tunnel junction (MTJ), which is a component consisting of two ferromagnets separated by a thin insulator. If the insulating layer is thin enough (typically a few nanometers), electrons can tunnel from one ferromagnet into the other.

However, when the CoFeB layer (i.e., free layer) is sandwiched between the tunnel barrier and a Ta cap (layer), the energy density ($M_s tH_k$) of this material (CoFeB layer) is not particularly high. Since the energy density is directly related to the thermal activation energy of the patterned STT-RAM device, a low energy density material will not meet the retention requirement in small STT-RAM devices, thus affecting the scalability of this material (CoFeB layer). $M_s$ is the saturation magnetization of the free layer material, t is the thickness of the free layer, and $H_k$ is the perpendicular anisotropy field of the free layer. The thermal activation energy barrier of a patterned device is given by the expression: $M_s \cdot t \cdot H_k \cdot A$, where A is the area of the patterned device, when the device size is small. The $M_s tH_k$ product is referred to as energy density. For a given device size, the higher the $M_s tH_k$ product, the higher the thermal activation energy barrier which translates to better retention.

Embodiments disclose free layer materials and structures that have high perpendicular magnetic anisotropy energy density. Perpendicular magnetic anisotropy energy density refers to the product of free layer saturation magnetization $M_s$, free layer thickness t, and perpendicular anisotropy field $H_k$.

There have been reports on a CoFeB layer sandwiched by two MgO tunnel barriers with enhanced energy density. However, in that case, the resistance area product (RA) is increased (because of the existence of two tunnel barriers and the resistance adds up). Accordingly, the TMR will be deteriorated. Note that there is a delicate balance between perpendicular magnetic anisotropy (PMA) energy density and junction RA in this material system. By choosing the right cap materials and oxidation condition, the PMA energy density can be largely improved without affecting the junction RA. In a patterned device, the junction resistance across the tunnel barrier=RA (resistance area product)/area A.

In embodiments, the cap materials that enhance CoFeB PMA energy density include Mg oxide, Ti oxide, Mg/Ti oxide, and Mg/Ta oxide. In this case, the oxides were made by depositing metal layers first and then oxidizing the metal layers by natural or radical oxidation. In oxide caps, the metal layer thickness is between 1 angstrom (Å) to 10 Å. Both the PMA energy density and junction RA depend on the thickness and detailed oxidation condition of the metal layers.

Magnetic anisotropy is the directional dependence of a material's magnetic properties. In the absence of an applied magnetic field, a magnetically isotropic material has no preferential direction for its magnetic moment, while a magnetically anisotropic material will align its moment with one of the easy axes (as discussed herein perpendicular magnetic anisotropy (PMA) is aligned perpendicularly). An easy axis is an energetically favorable direction of spontaneous magnetization that is determined by the sources of magnetic anisotropy.

Now turning to the figures, FIG. 1A illustrates a cross-sectional view of a spin torque transfer random access memory (STT-RAM) device 100 utilizing magnetic materials with perpendicular magnetic anisotropy according to an embodiment. The device structure of the STT-RAM device 100 includes a magnetic tunnel junction (MTJ) 70. The magnetic tunnel junction 70 has a reference magnetic layer 20, a tunnel barrier 30 on the reference magnetic layer 20, and a free magnetic layer 40 on the tunnel barrier 30. The reference magnetic layer 20 is on a seed layer 10. The seed layer 10 may be one or more different materials (depending on the exact reference magnetic layer 20) to grow the reference magnetic layer 20. A metal oxide layer 45 is disposed on top of the free magnetic layer 40. In this case, the magnetic layer 40 is the material that forms the free layer 43, and other implementations free layer 43 are provided below. A cap layer 50 is disposed on top of the metal oxide layer 45. The reference magnetic layer 20 and the free magnetic layer 40 (of the free layer 43) sandwich the tunnel barrier 30 in between. The tunnel barrier 30 is a thin insulator.

The free layer 43 is shown with double arrows to illustrate that spin torque current (or spin polarized current) via voltage source 75 can flip the magnetic orientation of the free magnetic layer 40 to up or down as desired. The reference magnetic layer 20 is shown with an up arrow to illustrate a magnetic orientation in the up direction. To write the STT-RAM device 100, the voltage source 75 applies voltage such that a spin torque current may flip the magnetic orientation of the free magnetic layer 40 as desired. When the magnetic orientations of the free magnetic layer 40 and the reference magnetic layer 20 are parallel (i.e., pointing in the same direction), the resistance of the MTJ 70 is low (e.g., representing logic 0). When the magnetic orientations of the free magnetic layer 40 and the reference magnetic layer 20 are antiparallel (i.e., pointing in opposite directions), the resistance of the MTJ 70 is high (e.g., representing a logic 1).

Figure 1C:
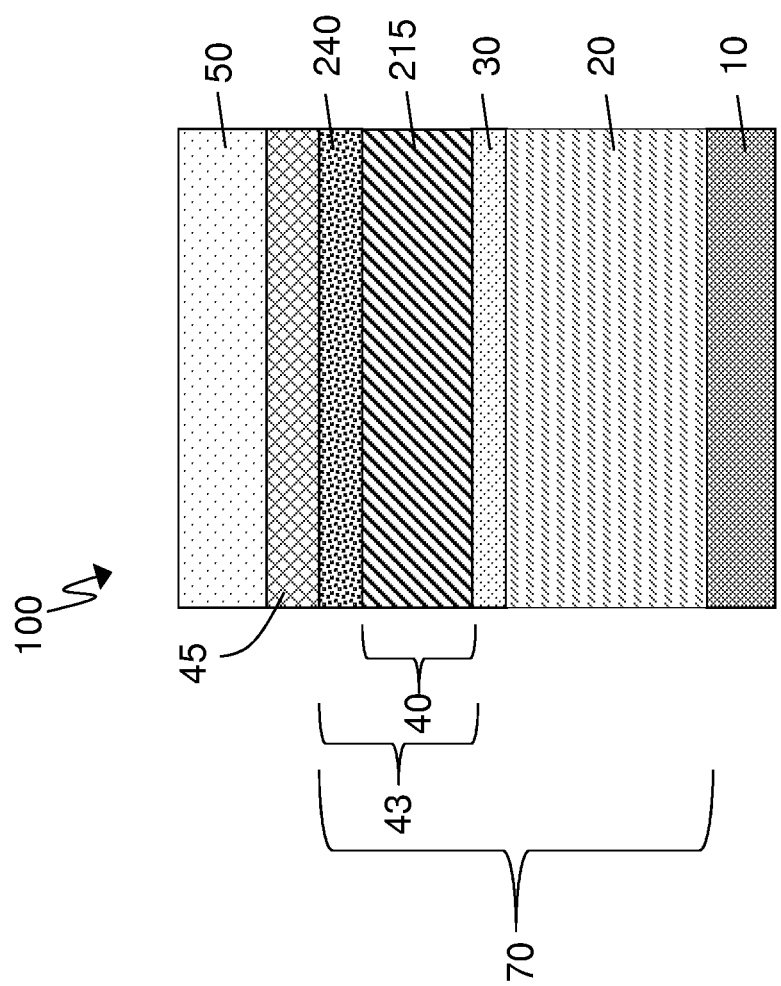
FIG. 1C illustrates a cross-sectional view of the STT-RAM device with an exemplary structure for the free layer with an iron layer according to another embodiment.

FIGS. 1B and 1C illustrate two examples of implementing the bottom part of free layer 43 (which is free magnetic layer 40) and the top part of the free layer 43 (which is Fe layer 240) according to embodiments. Note that the cap layer 50 is in direct contact with the metal oxide layer 45. As seen below, the structures discussed in FIGS. 1B and 1C show the Fe (iron) layer 240 on top of a magnetic layer 40 and in direct contact with the metal oxide layer 45. The free layer 43 is composed of two parts, magnetic layer 40 and the pure Fe layer 240. The two layers are strongly ferro-magnetically coupled together and switch as one entity under spin torque currents. According to embodiments, the Fe layer 240 is 100% pure iron. As noted above, this interfacial Fe layer 240 greatly improves the perpendicular anisotropy of the free layer material in free layer 43.

In one case, the bottom part of the free layer 43 (i.e., free magnetic layer 40) is grown/disposed first relative to the Fe layer 240. The bottom part of the free layer 43 (shown as free magnetic layer 40) may include iron but is not pure iron. That is, the bottom part of the free layer 43 (i.e., free magnetic layer 40) is not made of 100% and/or 99% pure iron (as is the case with the pure Fe layer 240). Next, the pure Fe layer 240 is grown/disposed on top of the bottom part of the free layer 43 (i.e., grown on top of free magnetic layer 40), such that the Fe layer 240 is pure as discussed herein. One skilled in the art understands how to grow pure iron (Fe) discussed herein without undue experimentation. Note that each layer (discussed herein) is in contact with and directly touching the layer above and/or below.

Figure 2A:
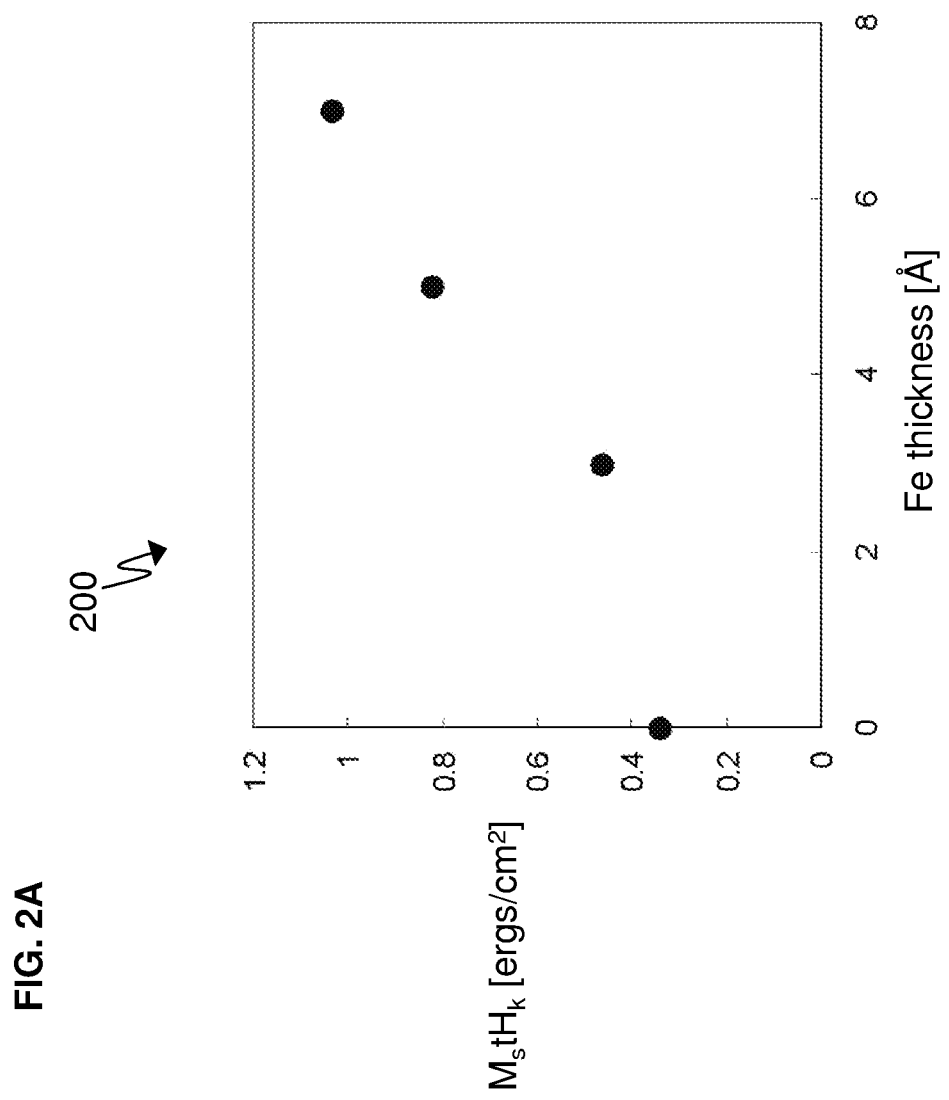
FIG. 2A illustrates a chart showing the effect of Fe layer thickness on $M_s tH_k$ in accordance with an embodiment.

The PMA induced by the oxide cap layer 50 is related to the Fe and oxygen bonding at the interface between the pure Fe layer 240 and the oxide cap layer 50. According to embodiments, it was found that PMA strength improves significantly as the Fe layer 240 thickness increases from 0 Å to 3 Å, from 3 Å to 5 Å, and from 5 Å to 7 Å, shown in FIG. 2A. However, the junction RA can be increased significantly. FIG. 2A shows the effect of Fe layer thickness on $M_a tH_k$ in chart 200. In general, the thicker the Fe layer 240, the higher the $M_a tH_k$.

Figure 2B:
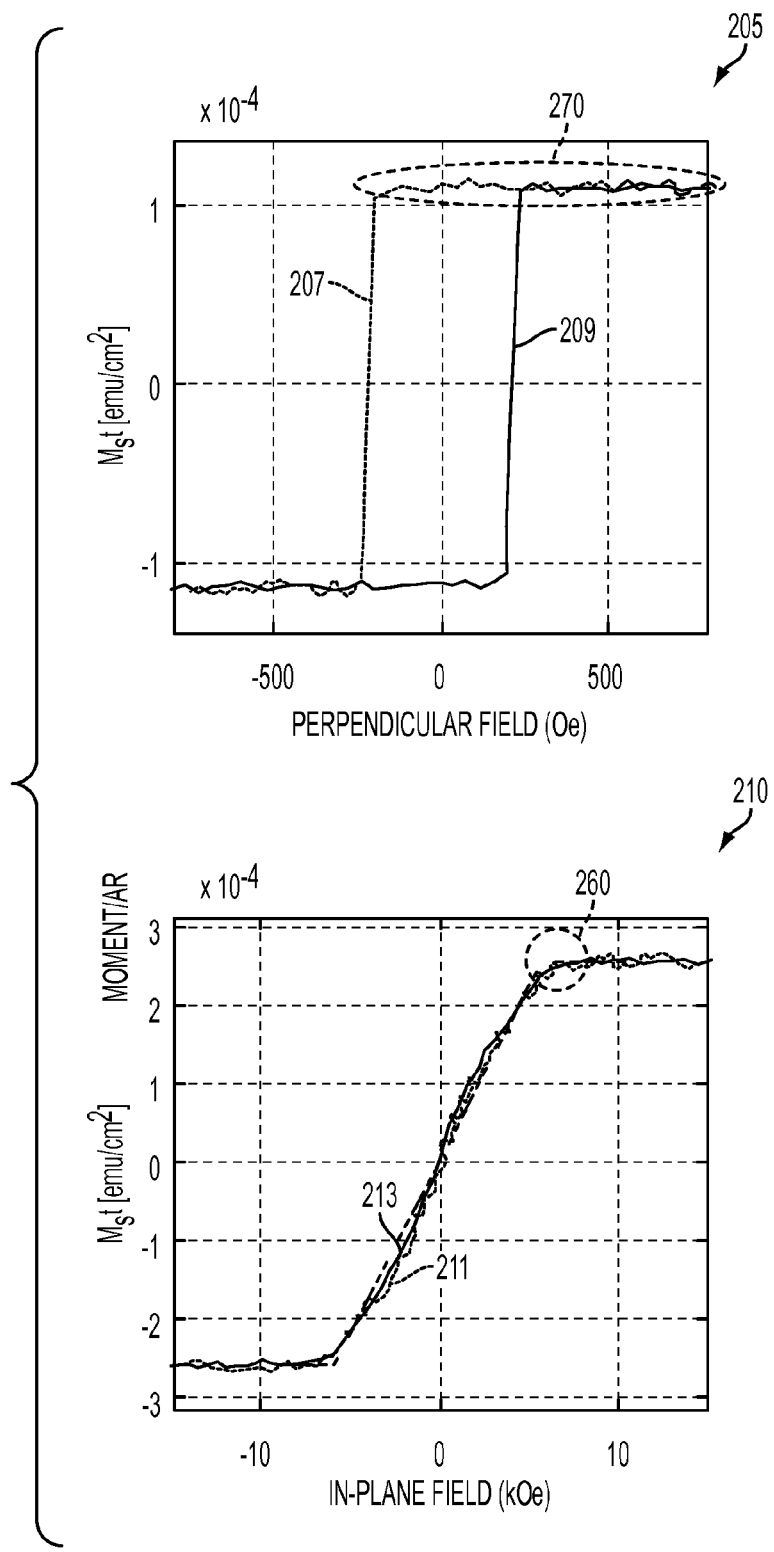
FIG. 2B illustrates charts showing the perpendicular field and the in-plane field according to an embodiment.

FIG. 2B shows magnetic properties of a sample structure with 5 Å Fe at the oxide interface. The $M_a tH_k$ is found to be 0.66 ergs/cm$^2$ with $H_k$ of 6 kOe, where erg is the unit of energy and mechanical work. This is much higher than the $M_a tH_k$ that can be achieved in samples without the Fe layer 240. Particularly, FIG. 2B illustrates a chart 205 and chart 210 of the magnetic property of one particular example according to an embodiment. The chart 205 shows the magnetic perpendicular field (i.e., vertical) strength (in Oersteds (Oe)) on the horizontal axis and shows the moment thickness product ($M_s t$ in emu/cm$^2$) on the vertical axis. The magnetic perpendicular field is the easy axis of the device 100. In this particular sample, 5 Å of Fe layer was used. The oxide cap is Mg and Ti metal layers oxidized by a natural oxidation process.

The line 207 shows the measured magnetic moment when a perpendicular magnetic field is applied which traverses from a positive magnetic field (e.g., +800 Oe) to negative magnetic field (e.g., −800 Oe). Line 209 shows the measured magnetic moment when the perpendicular magnetic field is applied which traverse from a negative magnetic field (e.g., −800 Oe) to positive magnetic field (e.g., +800 Oe). In chart 205, the saturation moment (when the perpendicular magnetic field is applied) is denoted by 270 as the $M_s t$.

The chart 210 shows the magnetic in-plane field strength (in kilo Oersteds (kOe)) on the horizontal axis and shows the moment thickness product ($M_s t$ in emu/cm$^2$) on the vertical axis. In this particular sample, the $H_k$ is measured to be 6 kOe denoted by 260 as the saturation in-plane magnetization field.

Figure 2C:
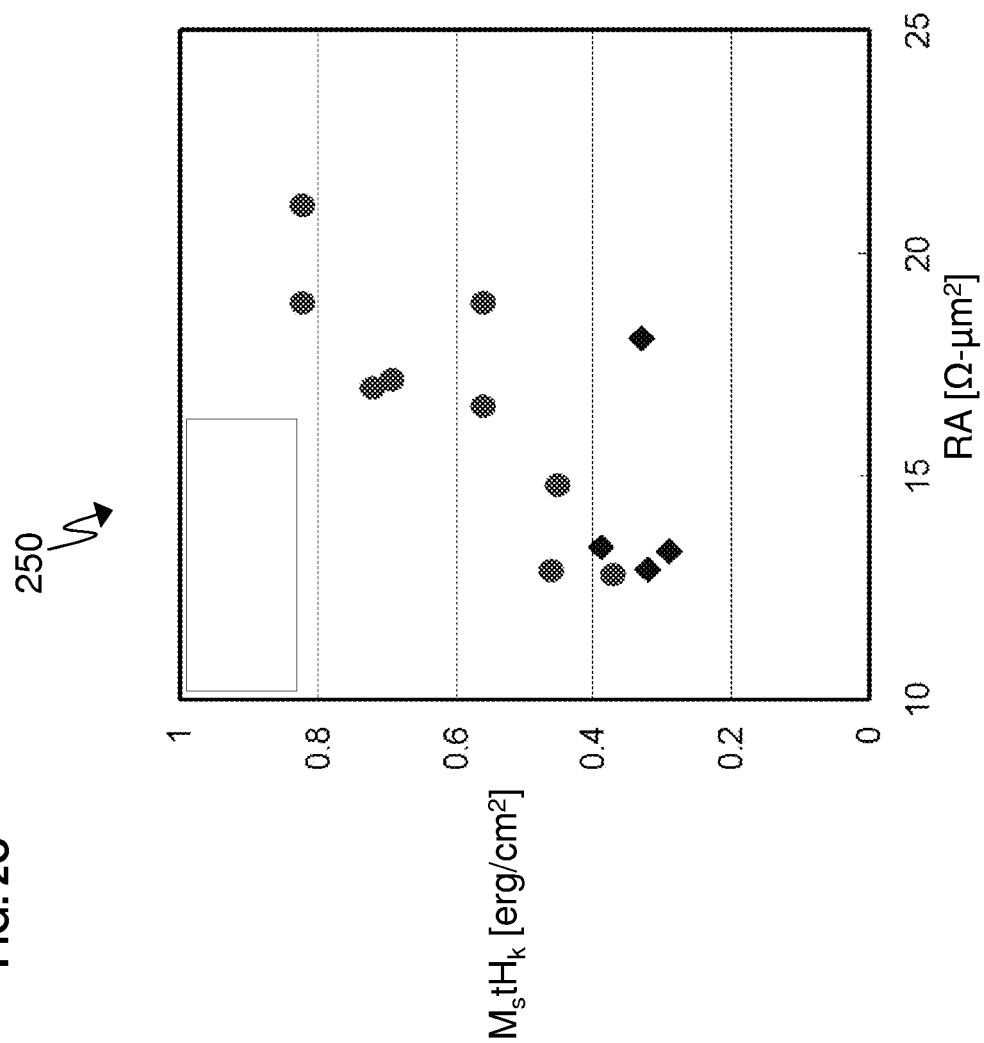
FIG. 2C illustrates a chart comparing the $M_s tH_k$ of two types of samples, one with and without the Fe layer, according to an embodiment.

FIG. 2C compares the $M_s tH_k$ of two types of samples with and without 5 Å Fe layer in chart 250. The chart 250 shows that the Fe layer 240 improves the magnetic perpendicular anisotropy of the device. In FIG. 2C, the circle points are the samples with 5 Å of Fe layer 240. The diamond points are samples without the Fe layer 240. The RA value quoted here is measured in so called "half stacks". Half stacks have an artificially thin reference layer, a barrier layer, and the exact free layer of interest. In this particular design, half stacks with RA value from 12-20 will give a RA of 3-6 in the full stacks with real reference layer, MgO barrier, and exactly the same free layer.

Now turning to examples, FIG. 1B illustrates the STT-RAM device 100 with an exemplary structure of the bottom part of the free layer 43 as magnetic layer 40 and the Fe layer 240 directly on top (as an upper part of the free layer 43) according to an embodiment. The layers previously discussed in FIG. 1A are also shown.

In FIG. 1B, the magnetic layer 40 includes a first magnetic layer 210, a spacer layer 220, and a second magnetic layer 230. The (pure) Fe layer 240 is directly on top of the second magnetic layer 230 and the metal oxide layer 45 is directly on top of the Fe layer 240.

In the bottom part of the free layer 43, the first magnetic layer 210 is made of at least one of the following materials: Fe, CoFe, CoFeB, CoPt, FePt, CoPd, FePd, and/or combinations thereof. The second magnetic layer 230 is made of at least one of the following materials: Fe, CoFe, CoFeB, CoPt, FePt, CoPd, FePd, and/or combinations thereof. The thickness of the first magnetic layer 210 ranges from 5 angstroms (Å) to 20 angstroms. The thickness of the second magnetic layer 230 ranges from 5 Å to 20 Å.

The spacer layer 220 is at least one of Ta, Ti, TiN, TaN, TaMg, TiMg and/or any combination thereof. The spacer layer 220 has a thickness ranging from 0.5 Å to 10 Å. The first magnetic layer 210 and the second magnetic layer 230 are ferromagnetically coupled by the spacer layer 220. Accordingly, the first magnetic layer 210 and the second magnetic layer 230 are configured to maintain the same magnetic orientation via the spacer layer 220. When the voltage source 75 (not shown in FIGS. 1B and 1C for the sake conciseness) generates the spin torque current (spin polarized current) as understood by one skilled in the art, the magnetic orientations (maintained in the same direction with respect to one another) of the first magnetic layer 210 and the second magnetic layer 230 (forming the magnetic layer 40) are both flipped in the same direction according to the angular momentum of the spin torque current. Accordingly, based on the free layer 43 (including the bottom part as free magnetic layer 40 and top part as Fe layer 240) being parallel to the reference magnetic layer 20, the resistance is low and the logic state is 0. On the other hand, based on the free layer 43 (including the bottom part as the free magnetic layer 40 and top part as Fe layer 240) being antiparallel to the reference magnetic layer 20, the resistance is high and the logic state is 1.

Now, further discussion is provided regarding the metal oxide layer 45. In the first oxidation example, the metal oxide layer 45 is made by depositing metal layers first (for example, metal layers of Mg and Ti) and then oxidizing the metal layers by an oxidation process. The oxidation process to oxidize the metal layers may include natural oxidation, or radical oxidation as understood by one skilled in the art.

In the second oxidation example, the metal oxide layer 45 is formed by depositing metal layers (for example, metal layers of Mg and Ti) first, oxidizing the metal layers by an oxidation process, and then depositing another metal layer (for example, a metal layer of Mg) after the oxidation process. The oxidation process to oxidize the metal layers may include natural oxidation, or radical oxidation as understood by one skilled in the art.

In the first and second oxidation examples for making the metal oxide layer 45, the metal layer material may include at least one of Mg, Ti, Ta, Ru, Hf, La, Al and any combination thereof. The metal layers used in metal oxide layer 45 have thicknesses between 1 Å to 20 Å.

The cap layer 50 is composed of at least one of Ru, Pd, Pt, Ta, TiN, and any combination thereof. The thickness of the cap layer 50 ranges from 2 Å to 40 Å (or more). The choice of this cap layer 50 has a significant impact on both free layer perpendicular magnetic anisotropy and junction RA.

FIG. 1C illustrates the STT-RAM device 100 with an exemplary structure of the bottom part of the free layer 43 (shown as free magnetic layer 40) and the pure Fe layer 240 directly on top according to an embodiment. The free layer 43 is composed of two parts, the magnetic layer 40 and the pure Fe layer 240. Again, the two layers are strongly ferro-magnetically coupled together and switch as one entity under spin torque currents. In FIG. 1C, the bottom part of the free layer 43 is composed of a magnetic layer 215. In this case, the Fe layer 240 is disposed on top of the magnetic layer 215, and the metal oxide layer 45 is disposed on top of the magnetic layer 215. The magnetic layer 215 is disposed on the tunnel barrier 30. The pure Fe layer 240 strengthens the perpendicular anisotropy (perpendicular magnetic field) of the magnetic layer 40.

The magnetic layer 215 includes at least one of the following materials: Fe, CoFe, CoFeB, CoPt, FePt, CoPd, FePd, and combinations thereof. The magnetic layer 215 has a thickness ranging from 10 Å to 30 Å. As noted above, the first and second oxidation examples may be utilized for making the metal oxide layer 45. In the first oxidation example, the metal oxide layer 45 is formed by depositing metal layers first and then oxidizing the metal layers by an oxidation process. In the second oxidation example, the metal oxide layer 45 is formed by depositing metal layers first, oxidizing the metal layers by an oxidation process, and then depositing another metal layer after the oxidation process. The metal layer material of the metal oxide layer 45 is at least one of Mg, Ti, Ta, Ru, Hf, Al and La. The metal layers used in metal oxide layer 45 have thicknesses between 1 Å to 20 Å.

Figure 3:
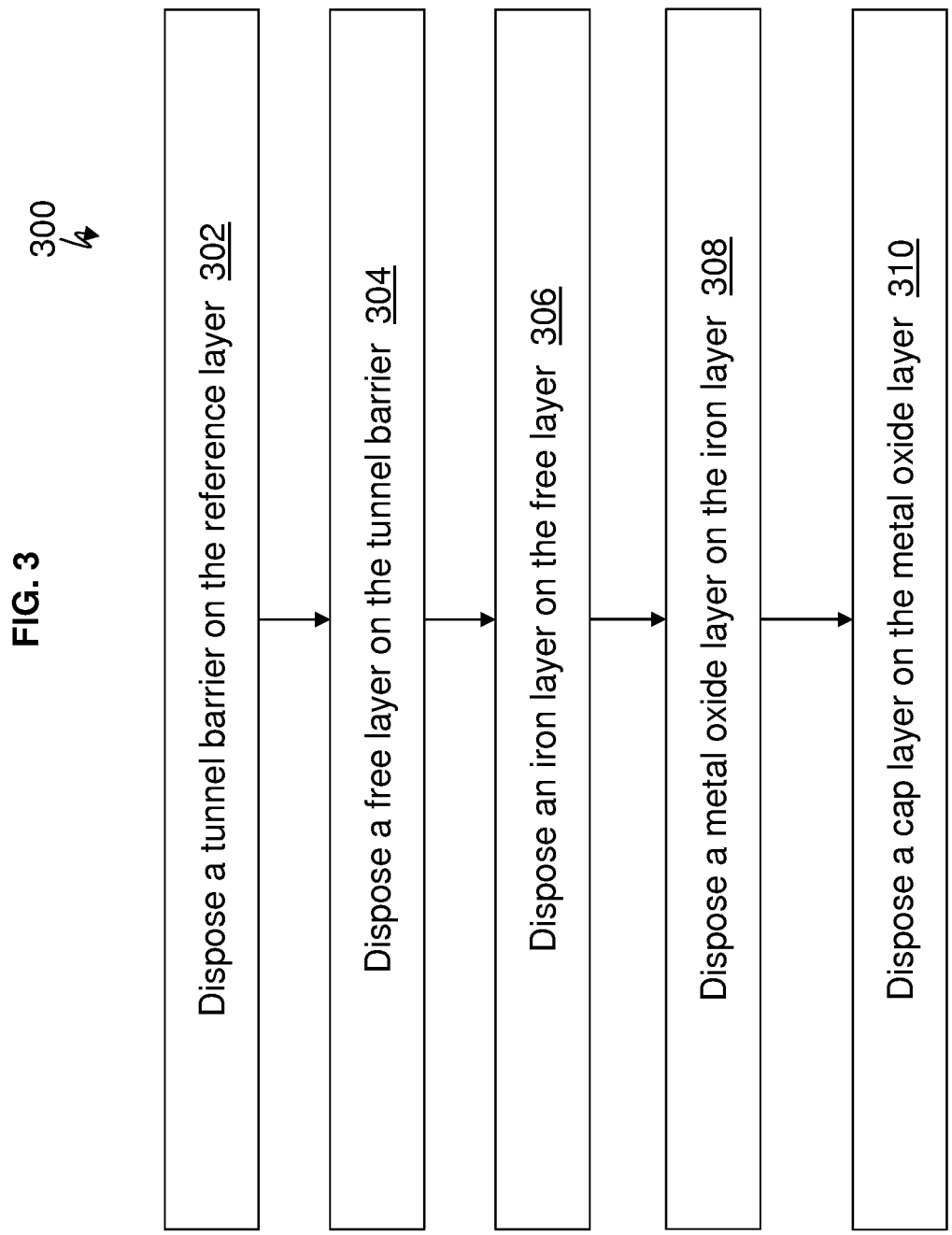
FIG. 3 illustrates a method of forming a spin torque transfer random access memory device according to an embodiment.

FIG. 3 illustrates a method 300 of forming a spin torque transfer random access memory device 100 according to an embodiment. Reference can be made to FIGS. 1A, 1B, and 1C.

The reference magnetic layer 20 is grown from or disposed on the seed layer 10. The tunnel barrier 30 is disposed on the reference magnetic layer 20 at block 302. The bottom part of the free layer 43 which is free magnetic layer 40 is disposed on the tunnel barrier 30 at block 304. The top part of the free layer 43 which is Fe (iron) layer 240 is disposed on the free magnetic layer 40 (which forms the free layer 43) at block 306. The metal oxide layer 45 is disposed on the Fe layer 240 at block 308, and the cap layer 50 is disposed on the metal oxide layer 45 at block 310.

Referring to FIG. 1C, the free layer 43 includes the magnetic layer 215 and Fe layer 240. The magnetic layer 215 is disposed on the tunnel barrier 30. The Fe (iron) layer 240 is disposed on the magnetic layer 215.

Referring to FIG. 1B, the free layer 43 includes a first magnetic layer 210 disposed on the tunnel barrier 30, a spacer layer 220 disposed on the first magnetic layer 210, a second magnetic layer 230 disposed on the spacer layer 220, and the Fe (iron) layer 240 disposed on the second magnetic layer 230.

The bottom part (i.e., magnetic layer 40) of the free layer 43 is separate and distinct from the (top part) Fe layer 240. For example, the Fe layer 240 is not mixed into the bottom part of the free layer 43 (i.e., not mixed into magnetic layer 40) to form a mixture and/or alloy. In one case, the iron layer is 99% pure iron. In another case, the iron layer is 100% pure iron. The Fe (iron) layer 240 has a thickness ranging from 1-10 angstroms.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A spin torque transfer random access memory device, comprising:
    a tunnel barrier disposed on a reference layer;
    a free layer disposed on the tunnel barrier;
    wherein the free layer includes a first magnetic layer disposed on the tunnel barrier, a spacer layer disposed on the first magnetic layer, a second magnetic layer disposed on the spacer layer, and an iron layer disposed on the second magnetic layer;
    a metal oxide layer disposed on the iron layer; and
    a cap layer disposed on the iron layer.

2. The device of claim 1, wherein the iron layer is separate and distinct from the first magnetic layer, the spacer layer, the second magnetic layer.

3. The device of claim 1, wherein the iron layer is 99% pure iron.

4. The device of claim 1, wherein the iron layer is 100% pure iron.

* * * * *